United States Patent
Ramamurthy Nag et al.

(10) Patent No.: US 12,068,055 B2
(45) Date of Patent: Aug. 20, 2024

(54) MANAGING PERFORMANCE AND SERVICE LIFE PREDICTION FOR A MEMORY SUBSYSTEM USING ENVIRONMENTAL FACTORS

(71) Applicant: Micron Technology, Inc., Boise, ID (US)

(72) Inventors: Abhilash Ramamurthy Nag, Bangalore (IN); Suresh Reddy Yarragunta, Bangalore (IN); Shiva Pahwa, Bangalore (IN)

(73) Assignee: MICRON TECHNOLOGY, INC., Boise, ID (US)

( * ) Notice: Subject to any disclaimer, the term of this patent is extended or adjusted under 35 U.S.C. 154(b) by 150 days.

(21) Appl. No.: 17/899,417

(22) Filed: Aug. 30, 2022

(65) Prior Publication Data

US 2024/0071441 A1 Feb. 29, 2024

(51) Int. Cl.
| | |
|---|---|
| *G11C 7/10* | (2006.01) |
| *G06F 11/30* | (2006.01) |
| *G06N 20/00* | (2019.01) |
| *G11C 29/00* | (2006.01) |
| *G11C 29/52* | (2006.01) |

(52) U.S. Cl.
CPC ........ *G11C 7/1096* (2013.01); *G06F 11/3058* (2013.01); *G06N 20/00* (2019.01); *G11C 7/1093* (2013.01); *G11C 29/00* (2013.01); *G11C 29/52* (2013.01); *G11C 2207/2245* (2013.01); *G11C 2207/229* (2013.01)

(58) Field of Classification Search
CPC ..... G11C 7/1096; G11C 7/1093; G11C 29/00; G11C 29/52; G11C 2207/2245; G11C 2207/229; G06F 11/3058; G06N 20/00
See application file for complete search history.

(56) References Cited

U.S. PATENT DOCUMENTS 9,761,294 B1 * 9/2017 Healy ................ G11C 11/1653

* cited by examiner

*Primary Examiner* — Jay W. Radke
(74) *Attorney, Agent, or Firm* — NICHOLSON DE VOS WEBSTER & ELLIOTT LLP

(57) ABSTRACT

Exemplary methods, apparatuses, and systems include an environmental operations manager for controlling memory access of the memory device. The environmental operations manager receives a set of data bits for programming to a memory location. The environmental operations manager receives environmental condition data. The environmental operations manager delays programming of the set of data bits to the memory location and writing the set of data bits to a buffer location in response to determining that the environmental condition data satisfies a threshold.

20 Claims, 4 Drawing Sheets

MANAGING PERFORMANCE AND SERVICE LIFE PREDICTION FOR A MEMORY SUBSYSTEM USING ENVIRONMENTAL FACTORS

TECHNICAL FIELD

The present disclosure generally relates to managing performance of memory subsystems, and more specifically, relates to managing performance and service life predictions using environmental factors.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
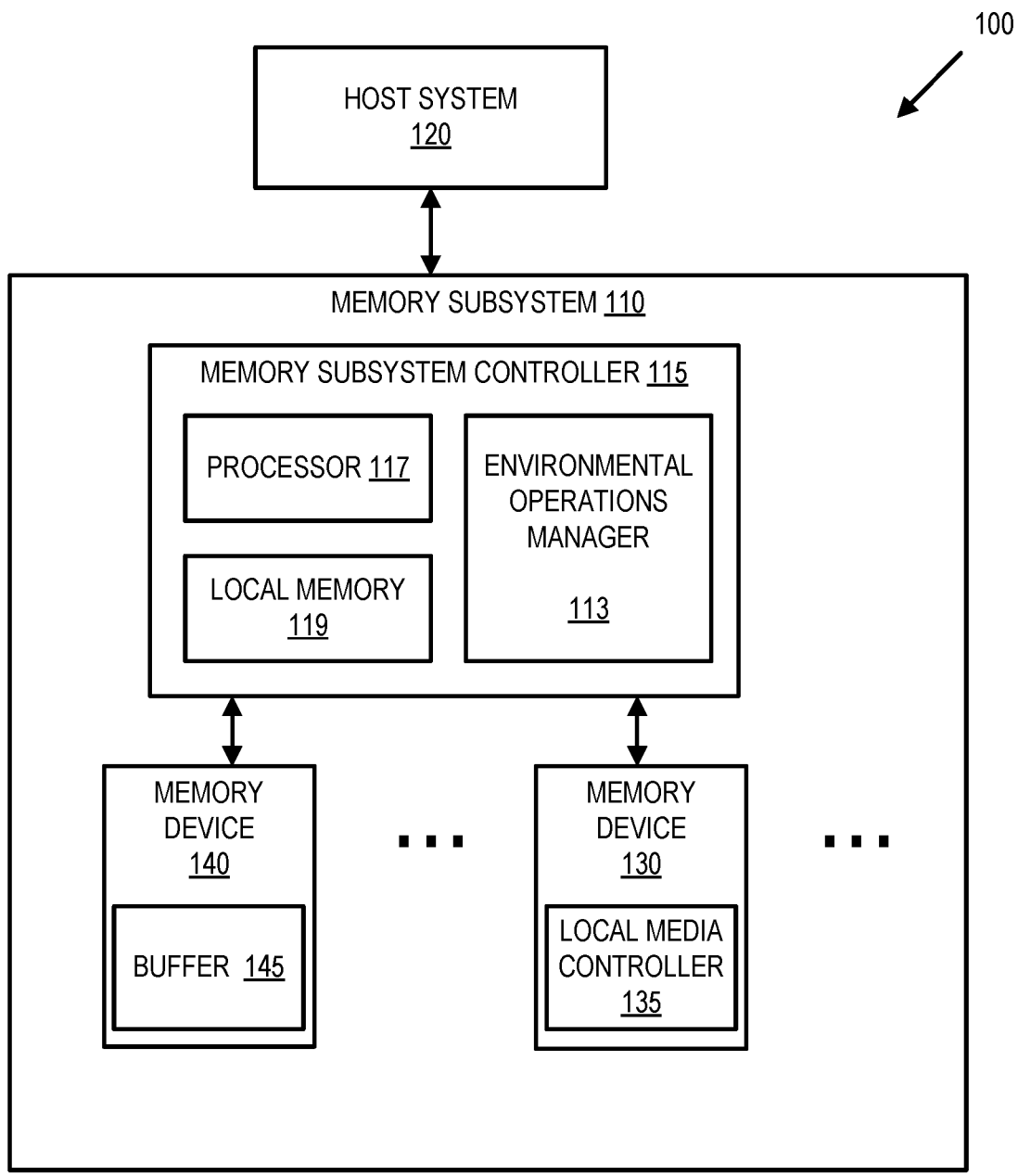
FIG. 1 illustrates an example computing system that includes a memory subsystem in accordance with some embodiments of the present disclosure.

Aspects of the present disclosure are directed to managing performance and service life predictions using environmental factors in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Unlike some traditional enterprise applications for memory subsystems, such as solid-state drives (SSDs), operating environments for automotive technology systems are widely variable. For example, during runtime operations, the memory subsystem may be exposed to variation in temperatures, variable frequency and intensity of vibrations, or changing atmospheric pressures (e.g., altitude changes). Over the lifetime of a memory subsystem, some environmental conditions in which the vehicle operates may negatively impact the lifespan of the memory subsystem. In typical systems, operations can be disrupted or result in errors due to one or more environmental conditions that are unfavorable for operation of the memory subsystem. For example, a memory subsystem that is operating under environmental conditions such as a high temperature, which exceeds a recommended performance point of the memory subsystem, can result in an error during memory access operations. Because operations are typically performed despite unfavorable environmental conditions, the errors generated interfere with proper functioning or reduce the lifecycle of the memory subsystem. As a result, the memory subsystem may unexpectedly fail or experience accelerated aging, which leads to increased replacement frequency or host data loss.

Aspects of the present disclosure address the above and other deficiencies by implementing control on memory access operations during unfavorable environmental conditions for the memory subsystem. An environmental operations manager measures environmental conditions under which the memory subsystem is operating and predicts potential errors when one or more environmental conditions satisfies a threshold environmental condition. The environmental operations manager writes data to a buffer during time intervals when environmental conditions are unfavorable or likely to produce an error in the memory operation. By controlling the memory operations based on environmental conditions, the environmental operations manager enables the memory subsystem to reduce a number of errors that occur. Accordingly, the environmental operations manager improves reliability and the service life of the memory subsystem by reducing errors and the corresponding retirement of memory dice that are caused by unfavorable environmental conditions.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM). As illustrated in FIG. 1, the memory device 140 includes a buffer 145 that can receive and temporarily store data bits from the environmental operations manager 113.

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an environmental operations manager 113 that can monitor a set of environmental conditions that are measured by multiple sensors operatively coupled to the environmental operations manager 113. In some embodiments, the controller 115 includes at least a portion of the environmental operations manager 113. For example, the controller 115 can include a processor 117 (processing device) configured to execute instructions stored in local memory 119 for performing the operations described herein. In some embodiments, an environmental operations manager 113 is part of the host system 120, an application, or an operating system.

The environmental operations manager 113 can control the programming of data bits to memory locations depending on environmental conditions. In an embodiment, the environmental operations manager 113 monitors environmental conditions that are received from a set of environmental sensors of the host system 120. Environmental condition data includes measurements of operating conditions of the vehicle such as temperature, vibration, ambient pressure, altitude, accelerations, or operation location. The environmental operations manager 113 stores measured values as a set of historical environmental condition data in the memory subsystem 110, such as in memory device 130. The environmental operations manager 113 also detects various programming errors during a runtime of the memory subsystem 110 and correlates one or more values of the historical environmental condition data that were present when the programming error occurred.

Throughout the runtime of the memory subsystem 110, the environmental operations manager 113 can determine a threshold set of environmental conditions that are used to predict programming errors. By comparing the environmental conditions to the threshold set of environmental conditions, the environmental operations manager 113 can delay a write to memory (e.g., write to a buffer) to reduce the programming errors caused by unfavorable environmental conditions. As a result, the environmental operations manager 113 extends a service life of the memory device 130. Further details with regards to the operations of the environmental operations manager 113 are described below.

Figure 2:
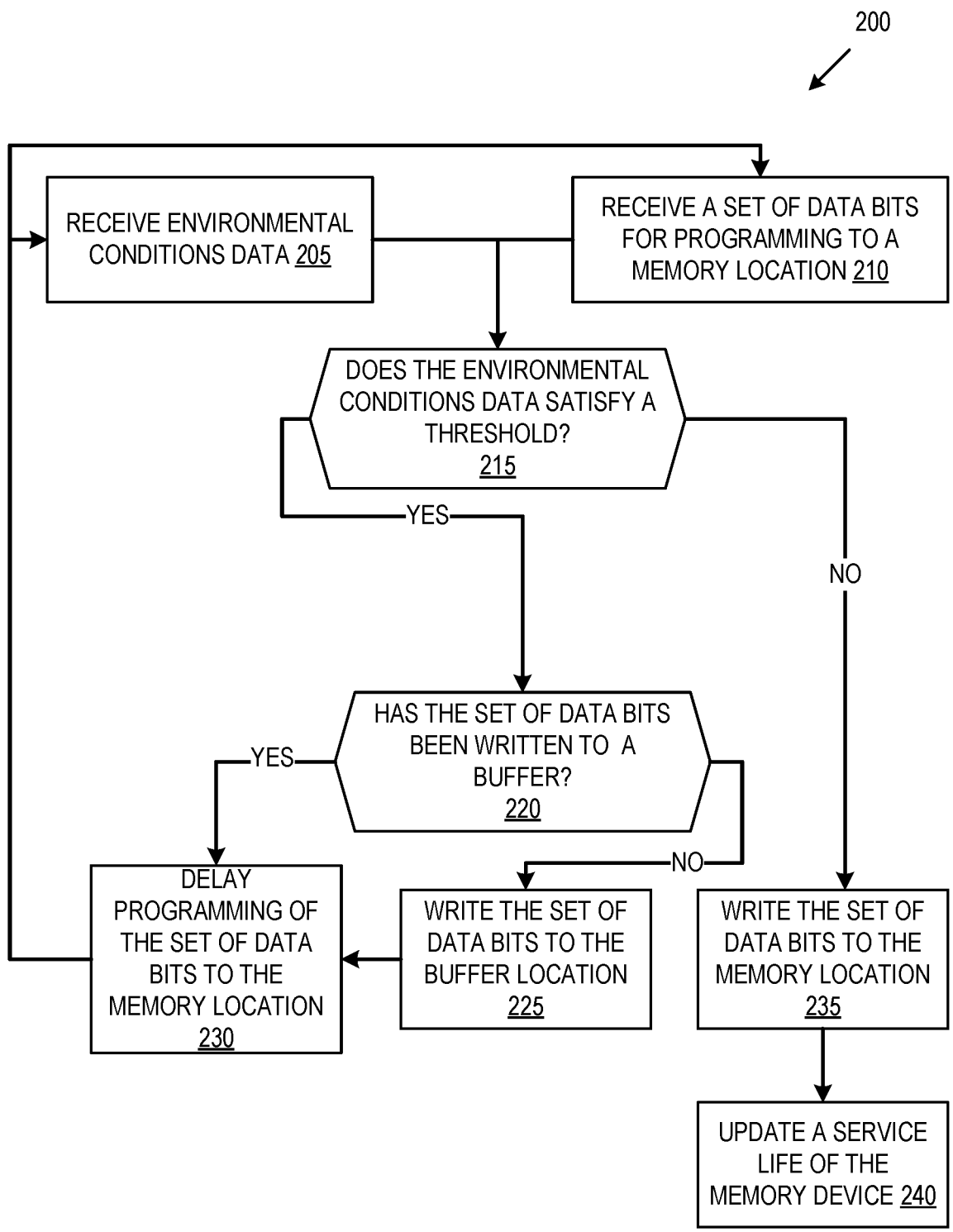
FIG. 2 is a flow diagram of an example method to managing performance and service life predictions in accordance with some embodiments of the present disclosure.

FIG. 2 is a flow diagram of an example method to managing performance and service life predictions in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the environmental operations manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. While FIG. 2 is described with regard to using particular environmental conditions, other conditions including vehicle conditions can be used to perform the operations of method 200.

At operation 205, the environmental operations manager 113 receives environmental conditions data. In some embodiments, the environmental operations manager 113 receives a set of measured environmental conditions from the host system 120 or directly from a sensor of the vehicle. For example, a temperature sensor, and/or a vibration sensor provide a set of environmental condition data to the environmental operations manager 113. The set of environmental conditions can include, but are not limited to an external temperature, a component temperature (e.g., hood temperature), a tire pressure, a shock or vibration, humidity, air pressure (e.g., or altitude directly), or location information (e.g., terrain type, altitude, etc.).

At operation 210, the environmental operations manager 113 receives a set of data bits for programming to a memory location. For example, receive sets of data bits for programming to the memory devices. In some embodiments, the environmental operations manager 113 receives any number of data bits that can be programmed to memory device 130. The environmental operations manager 113 can be configured to program data bits to memory using any number of programming schemes (e.g., single pass programming, multi-pass programming, other programming schemes).

At operation 215, the environmental operations manager 113 determines if the environmental conditions data satisfies a threshold. In some embodiments, the environmental operations manager 113 compares a set of one or more current environmental conditions, such as a most recently received set of environmental condition data, with a set of one or more threshold environmental conditions. If the environmental condition data satisfies the threshold, the method 200 proceeds to operation 220. If the environmental condition data does not satisfy the threshold, the method 200 proceeds to operation 235.

In one example, the threshold environmental conditions are pre-determined during a configuration process of the memory subsystem 110. The threshold of environmental condition data includes a set of threshold conditions including a threshold temperature, a threshold tire pressure, a threshold vibration, a threshold altitude (e.g., ambient pressure). Each threshold condition is a value of the environmental condition at which a programming error is more likely to occur. These threshold values can be set using a deviation from a nominal operating point, a physical device design specification, or an absolute performance limit of the memory subsystem 110. In some embodiments, the threshold values can be implemented as deviation from a range of expected operating conditions.

In another example, a machine learning model sets the threshold environmental conditions to predict environmental conditions that are likely to create programming errors. A training data set includes a set of historical environmental condition data and programming errors. The machine learning model creates a mapping between one or more environmental conditions and an occurrence of an error. The machine learning model assigns threshold values to each threshold environmental condition data for use in determining whether the environmental condition data satisfies the thresholds. In some embodiments, the threshold values can be implemented as deviation from a range of predicted operating conditions. During training, the machine learning model determines a mapping between the historical environmental condition data and an error rate. Using the mapping, the machine learning model can generate an updated threshold environmental condition.

At operation 220, the environmental operations manager 113 determines if the set of data bits have been written to a buffer. In some embodiments, various environmental conditions may occur for a time interval (e.g., an excessive temperature) that has a duration. For example, in a first iteration of method 200, the environmental condition data (e.g., sensor data) satisfies the threshold and the method 200 proceeds to operation 225 to write the set of data bits to a buffer location. For a subsequent iteration of the method 200, if the environmental condition satisfies the threshold with a sustained duration, operation 220 will identify that the set of data bits have been previously written to the buffer location (e.g., in the first iteration) and proceed to operation 230.

At operation 225, the environmental operations manager 113 writes the set of data bits to the buffer location. In some embodiments, the set of data bits are written to the buffer location when the environmental conditions are determined to be unfavorable and the set of data bits has not previously been written to the buffer. By writing the set of data bits to the buffer location, such as buffer 145, the environmental operations manager 113 reduces the number of errors that occur in the memory device 130 and thus extend the service life of the memory device 130.

At operation 230, the environmental operations manager 113 delays programming of the set of data bits to the memory location. In some embodiments, the environmental operations manager 113 computes a delay for the set of data bits. For example, the delay may be a pre-determined time delay using an estimated duration of the environmental condition that satisfies the threshold. A weighting factor can be applied to the delay for environmental conditions that exceed thresholds by particular distances, such as a tiered delay system that depends on the distance between the value of the environmental condition and the threshold environmental condition. Using a temperature threshold of 60° F. as an example, a first time delay can be applied for temperatures between 61-70° F., a second time delay can be applied for 71-80° F., and a third delay can be applied for any temperatures greater than 80° F.

During the time delay, the method 200 returns to operations 205 and 210. For example, the environmental operations manager 113 can perform the method 200 iteratively with multiple sets of data bits and multiple time delays. A sequence of programming delays and the respective set of data bits can be stored in the buffer location for programming to memory in the order in which the sets of data bits are received.

In some embodiments, the environmental operations manager 113 can delay programming the set of data bits to the memory location while the environmental conditions continue to satisfy the threshold. For example, the delay can be based on additional measured values of the environmental conditions and programming can be delayed until the thresholds are no longer satisfied by the environmental conditions (e.g., a loop of operations 205, 215, 220, and 230 until exiting to operation 235).

At operation 235, the environmental operations manager 113 writes the set of data bits to memory location. For example, the environmental operations manager 113 determines that the measured set of environmental conditions do not satisfy the threshold environmental conditions and a programming error is not likely to be caused by adverse environmental conditions. In response, the environmental operations manager 113 writes the set of data bits to the memory device 130. As described above, multiple sets of data bits may be written to the buffer while one or more environmental conditions is adverse and satisfies the respective threshold environmental condition. In these cases, when the thresholds are no longer satisfied, the environmental operations manager 113 may write multiple sets, up to and including all sets of data bits from the buffer location, to the memory device 130.

At operation 240, the environmental operations manager 113 updates a service life of the memory device. In some embodiments, the environmental operations manager 113 can compute an estimated service life of the memory device 130 using a number of errors (or an error rate) relating to the variations in the manufacturing process and a number of errors estimated to be caused by operation of the memory device 130. In one embodiment, the updated service life is computed by the actual errors falling short of the number of errors estimated by operation of the memory device.

In one embodiment, the environmental operations manager 113 monitors a number of occurrences when the difference between the environmental condition and the historical environmental condition data satisfies the threshold and determine, using the number of occurrences, an adjustment to a service life of a memory device. For example, the environmental operations manager 113 can use a formula or look up table to map the number of occurrences to an adjustment in service life. In one embodiment, the environmental operations manager 113 generates a notification to a client device of the adjustment to the service life of the memory device.

In some embodiments, the method 200 is performed iteratively during a runtime of the environmental operations manager 113. For each iteration, various operations of method 200 are performed. For instance, in a first iteration, the environmental operations manager performs operations 205, 210, 215, 220, 225, and 230. In a second iteration, the environmental operations manager 113 performs operations 205 and/or 210, 215, 235, and 240. During the second iteration, the method 200 involves the environmental operations manager 113 receiving additional environmental condition data, comparing the additional environmental condition with the historical environmental condition data, and determining that a second difference between the additional environmental condition data and the historical environmental condition data does not satisfy the threshold in response to comparing the environmental condition data with the historical environmental condition data. After determining that the difference between the additional environmental condition data and the historical environmental condition data does not satisfy the threshold, the environmental operations manager 113 writes the set of data bits to the memory location.

Figure 3:
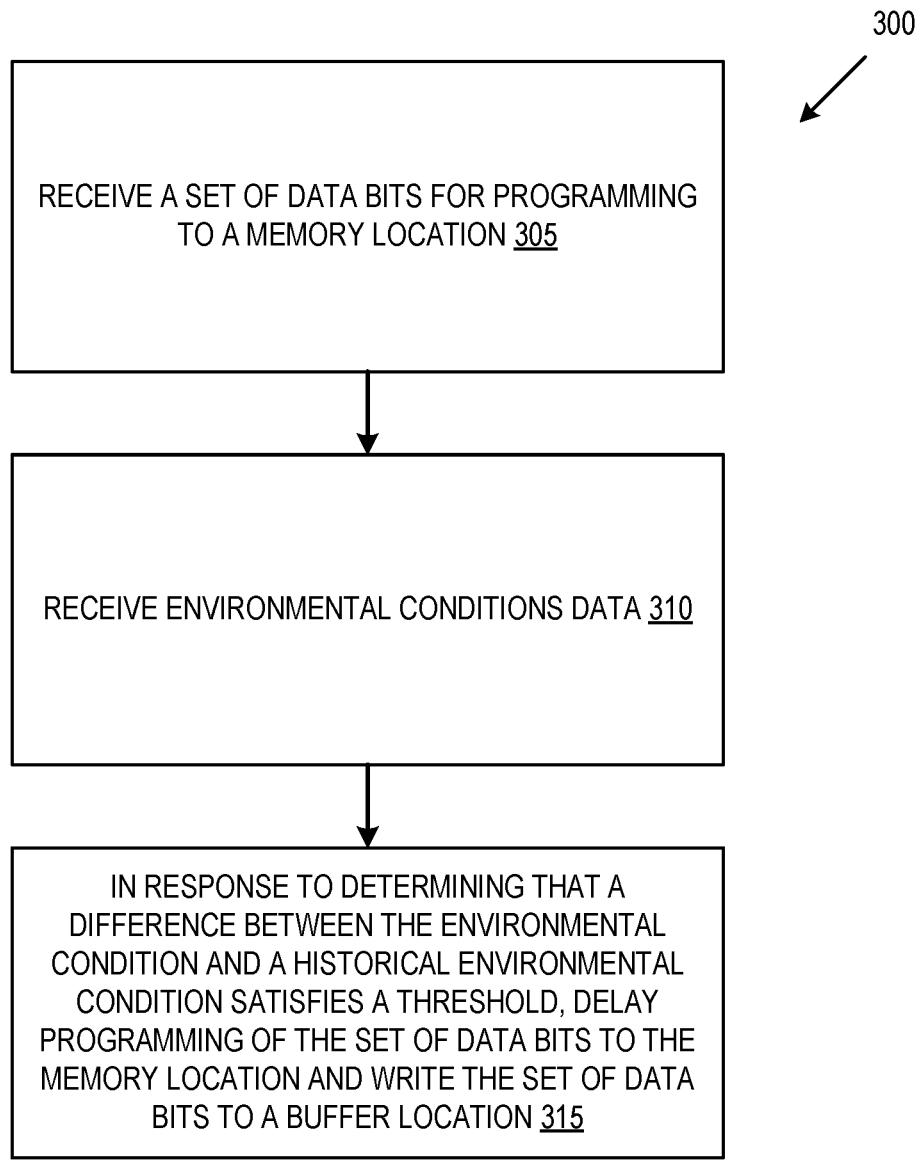
FIG. 3 is a flow diagram of an example method to managing performance of memory subsystems in accordance with some embodiments of the present disclosure.

FIG. 3 is a flow diagram of an example method to managing performance of memory subsystems in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the environmental operations manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives a set of data bits for programming to a memory location. As described above at operation 210, the processing device is configured to receive data bits from the host system 120. For example, the processing device receives any number of data bits that can be programmed to memory device 130.

At operation 310, the processing device receives environmental condition data. As described above with respect to operation 205, the processing device receives a set of measured environmental conditions from a host or directly from sensors of the vehicle. For example, the processing device receives inputs from various sensors of the vehicle or externally coupled devices that measure environmental or vehicle operating conditions.

At operation 315, the processing device delays programming of the set of data bits to the memory location and writes the set of data bits to a buffer location in response to determining that the environmental condition satisfies a threshold. In some embodiments, the environmental condition satisfies the threshold if a value of the environmental condition data exceeds a value of the threshold. In other embodiments, the environmental condition satisfies the threshold if a difference between historical environmental condition data and the environmental condition data exceeds the threshold. As described with respect to operations 215, 220, 225, and 230, the processing device determines that the threshold environmental condition is satisfied, predicts a programming error, and determines that the set of data bits have not previously been written to the buffer. The processing device writes the set of data bits to the buffer location and delays the programming of the set of data bits to the memory location until the environmental condition no longer satisfies the threshold environmental condition.

Figure 4:
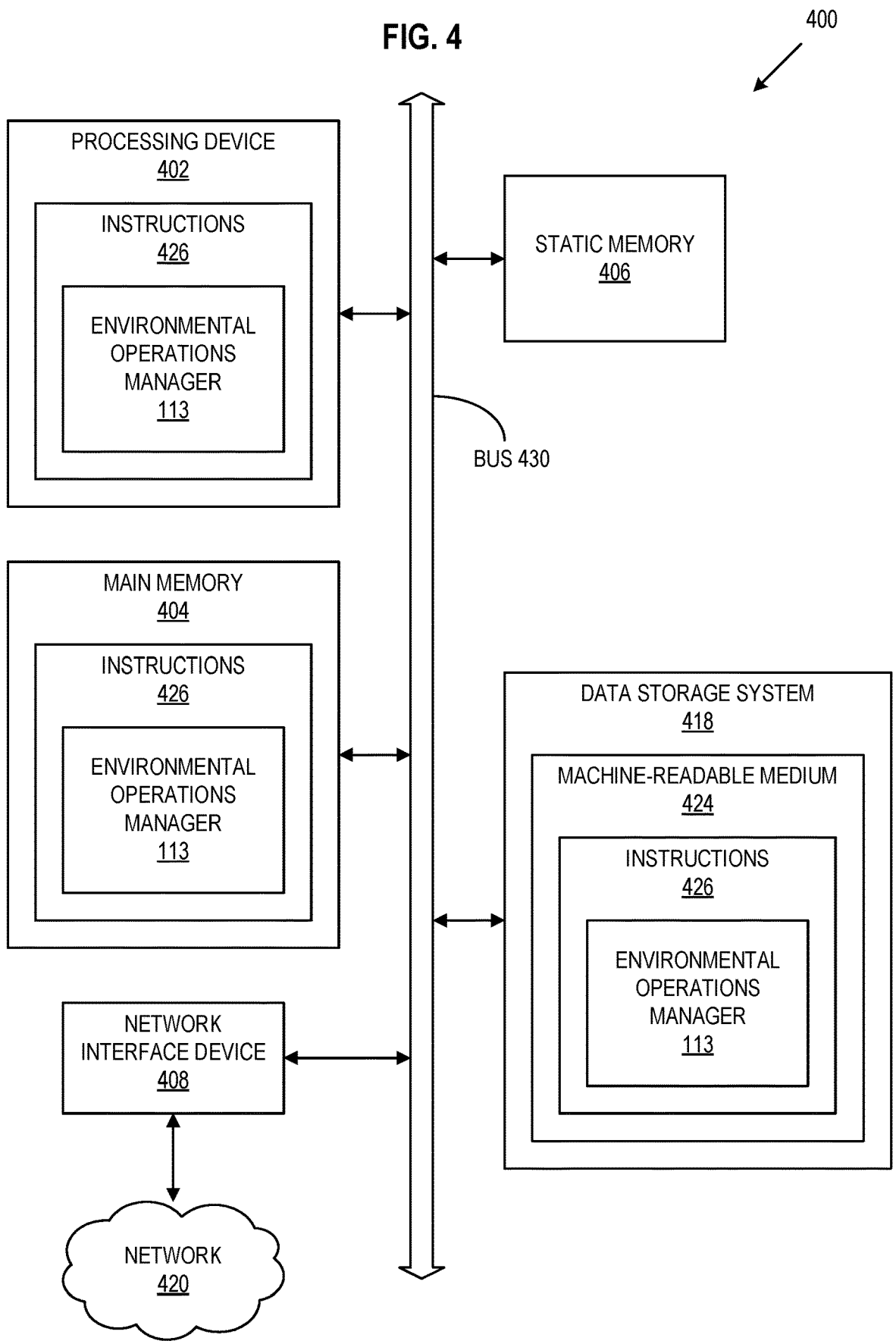
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the environmental operations manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) which stores one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to an environmental operations manager (e.g., the environmental operations manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 300 in response to its processor executing a computer program (e.g., a sequence of instructions) contained in a memory or other non-transitory machine-readable storage medium. A computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving a set of data bits for programming to a memory location;
receiving environmental condition data; and
in response to determining that environmental condition data satisfies a threshold:
delaying programming of the set of data bits to the memory location,
writing the set of data bits to a buffer location,
delaying one or more access memory commands for a pre-determined time delay, and
after the pre-determined time delay, writing the set of data bits to the memory location.

2. The method of claim 1, further comprising:
further in response to determining that the environmental condition data satisfies the threshold, determining if the set of data bits has been previously written to the buffer location; and
in response to determining that the set of data bits has been previously written to the buffer location, receiving additional environmental condition data.

3. The method of claim 1, further comprising:
receiving additional environmental condition data;
comparing the additional environmental condition data with the threshold;
in response to comparing the additional environmental condition data with the threshold, determining that the additional environmental condition data does not satisfy the threshold; and
writing the set of data bits to the memory location.

4. The method of claim 1, wherein the environmental condition data includes one or more of a temperature, a vibration, a pressure, or an altitude.

5. The method of claim 1, further comprising:
determining a mapping between historical environmental condition data and an error rate; and
generating, by a machine learning model, an updated threshold using the mapping between the historical environmental condition data and an error rate.

6. The method of claim 1, wherein determining that environmental condition data satisfies a threshold comprises determining that a difference between the environmental condition data and historical environmental condition data exceeds the threshold.

7. The method of claim 1, wherein determining that the environmental condition data satisfies a threshold comprises determining that a value of the environmental condition data exceeds a value of the threshold.

8. The method of claim 1 further comprising:
monitoring a number of occurrences when the environmental condition data satisfies the threshold;
determining, using the number of occurrences, an adjustment to a service life of a memory device; and
generating a notification of the adjustment to the service life of the memory device.

9. The method of claim 1, wherein the pre-determined time delay is a tiered delay dependent on a distance between a value of the environmental condition data and the threshold.

10. A non-transitory computer-readable storage medium comprising instructions that, when executed by a processing device, cause the processing device to:
receive a set of data bits for programming to a memory location;
receive environmental condition data; and
in response to determining that a difference between the environmental condition data and a historical environmental condition data satisfies a threshold, delay programming of the set of data bits to the memory location and writing the set of data bits to a buffer location.

11. The non-transitory computer-readable storage medium of claim 10, wherein the processing device is further caused to:
further in response to determining that the difference between the environmental condition data and the historical environmental condition data satisfies the threshold, determining if the set of data bits has been previously written to the buffer location; and
in response to determining that the set of data bits has been previously written to the buffer location, receiving additional environmental condition data.

12. The non-transitory computer-readable storage medium of claim 10, wherein the processing device is further caused to:
delay one or more memory access commands for a pre-determined time delay in response to determining that the difference between the environmental condition data and the historical environmental condition data satisfies the threshold; and
write the set of data bits to the memory location after the pre-determined time delay.

13. The non-transitory computer-readable storage medium of claim 10, wherein the processing device is further caused to:
receive additional environmental condition data;
compare the additional environmental condition data with the historical environmental condition data;
in response to comparing the environmental condition data with the historical environmental condition data, determine that a second difference between the additional environmental condition data and the historical environmental condition data does not satisfy the threshold; and
write the set of data bits to the memory location.

14. The non-transitory computer-readable storage medium of claim 10, wherein the historical environmental condition data includes one or more of a temperature, a vibration, a pressure, or an altitude.

15. The non-transitory computer-readable storage medium of claim 10, wherein the processing device is further caused to:
determine a mapping between the historical environmental condition data and an error rate; and
generate, by a machine learning model, an updated threshold using the mapping between the historical environmental condition data and an error rate.

16. The non-transitory computer-readable storage medium of claim 10, wherein the processing device is further caused to:
monitor a number of occurrences when the difference between the environmental condition data and the historical environmental condition data satisfies the threshold;
determine, using the number of occurrences, an adjustment to a service life of a memory device; and
generate a notification of the adjustment to the service life of the memory device.

17. A system comprising:
a plurality of memory devices; and
a processing device, operatively coupled with the plurality of memory devices, to:
receive a set of data bits for programming to a memory location;
receive environmental condition data;
in response to determining that the environmental condition data satisfies a threshold:
delay programming the set of data bits to the memory location,
write the set of data bits to a buffer location,
delay one or more memory access commands for a pre-determined time delay, and
after the pre-determined time delay, write the set of data bits to the memory location.

18. The system of claim 17, wherein the processing device is further caused to:
receive additional environmental condition data;
compare the additional environmental condition data with the threshold;
in response to comparing the additional environmental condition data with the threshold, determine that the additional environmental condition data does not satisfy the threshold; and
write the set of data bits to the memory location.

19. The system of claim 17, wherein the processing device is further caused to:
monitor a number of occurrences when the environmental condition data satisfies the threshold;
determine, using the number of occurrences, an adjustment to a service life of a memory device; and
generate a notification of the adjustment to the service life of the memory device.

20. The system of claim 17, wherein the pre-determined time delay is a tiered delay dependent on a distance between a value of the environmental condition data and the threshold.

* * * * *